(12) United States Patent
Chao

(10) Patent No.: US 7,508,855 B2
(45) Date of Patent: Mar. 24, 2009

(54) COMPACT HIGH OUTPUT POWER MID-INFRARED EMITTER SYSTEM AND METHOD

(75) Inventor: Christopher J. Chao, South Pasadena, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 139 days.

(21) Appl. No.: 10/592,179

(22) PCT Filed: Mar. 28, 2005

(86) PCT No.: PCT/US2005/010416

§ 371 (c)(1),
(2), (4) Date: Sep. 7, 2006

(87) PCT Pub. No.: WO2006/031254

PCT Pub. Date: Mar. 23, 2006

(65) Prior Publication Data

US 2007/0201520 A1    Aug. 30, 2007

Related U.S. Application Data

(60) Provisional application No. 60/556,652, filed on Mar. 26, 2004.

(51) Int. Cl.
*H01S 3/04* (2006.01)

(52) U.S. Cl. .......................................... 372/36; 372/34

(58) Field of Classification Search ................... 372/34, 372/36
See application file for complete search history.

(56) References Cited

U.S. PATENT DOCUMENTS

| 5,454,002 | A |   | 9/1995 | McCann |
|-----------|---|---|--------|--------|
| 5,628,196 | A | * | 5/1997 | Farmer ................ 62/51.1 |
| 5,629,097 | A |   | 5/1997 | McCann |
| 5,651,016 | A |   | 7/1997 | Yu et al. |
| 5,776,794 | A |   | 7/1998 | McCann |
| 6,195,372 | B1 |  | 2/2001 | Brown |
| 2002/0121863 | A1 | * | 9/2002 | Morishita ............. 315/169.3 |
| 2002/0182779 | A1 |   | 12/2002 | Bewley et al. |

\* cited by examiner

*Primary Examiner*—Minsun Harvey
*Assistant Examiner*—Tod T Van Roy
(74) *Attorney, Agent, or Firm*—Bryan Santarelli; Graybeal Jackson Haley; Daniel J. Long

(57) ABSTRACT

A mid-infrared emitter sub-system includes a heat sink and a diamond thermal diffusion layer connected to the heat sink through a first thermal bonding layer. The first thermal bonding layer has a first melting point. A semiconductor slab portion of a semiconductor laser is connected to the diamond thermal diffusion layer through a second thermal bonding layer. The second thermal bonding layer has a second melting point that is less than the first melting point.

16 Claims, 3 Drawing Sheets

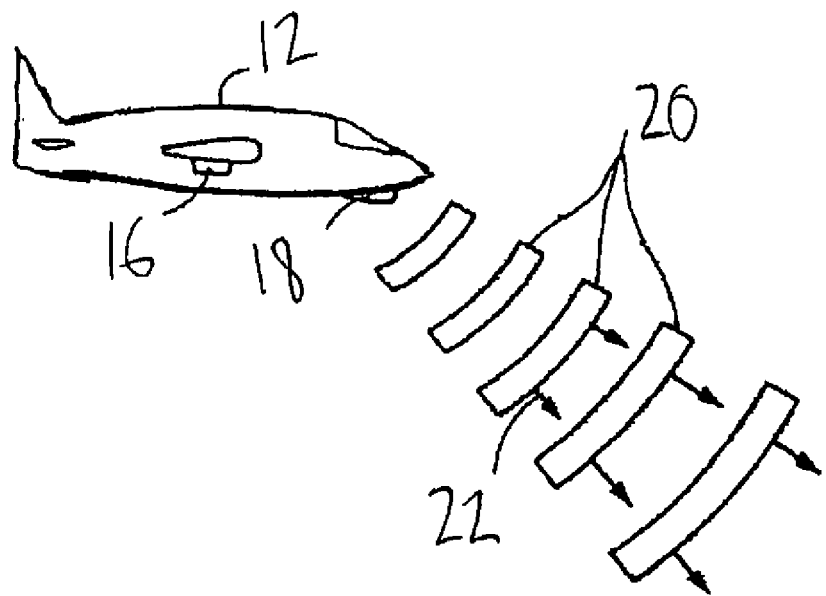
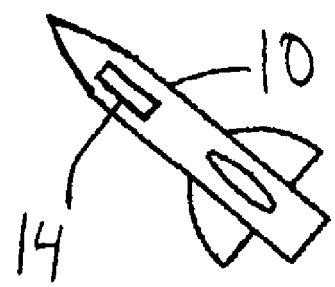
FIG. 1
(Background Art)

COMPACT HIGH OUTPUT POWER MID-INFRARED EMITTER SYSTEM AND METHOD

PRIORITY CLAIM

This application claims priority from U.S. Provisional Patent Application No. 60/556,652 filed on 26 Mar. 2004, which is incorporated herein by reference.

TECHNICAL FIELD

Embodiments of the present invention relate generally to lasers and more specifically to lasers utilized in infared emitters.

BACKGROUND OF THE INVENTION

Infrared emitters, which are devices that transmit or "emit" infrared radiation, are utilized in a variety of different applications. For example, infrared emitters are utilized in electronic countermeasures systems such as in the "jamming" of an infrared heat seeking missile for the purpose of protecting an aircraft containing the emitter. FIG. 1 illustrates a countermeasures situation in which a missile 10 attacks an aircraft 12. The missile 10 has a detector assembly 14 which is responsive to infrared radiation in the mid-infrared region. The mid-infrared region may be defined as infrared radiation having wavelengths in the range of 2 to 5 microns, but the specific definition may vary and other times is considered to be infrared radiation having wavelengths 1.3 to 3 microns. The aircraft 12 has jet engines 16, one of which is shown, which emit radiation in the form of infrared radiation in the mid-infrared region. As the missile 10 approaches the aircraft 12, the detector assembly 14 detects the infrared radiation emitted by the aircraft engines 16. The detector assembly 14 develops directional control signals which guide the missile toward the aircraft 12.

The aircraft 12 includes an infrared countermeasures system 18 containing an infrared emitter (not shown) which emits mid-infrared radiation in the form of a sequence of pulses 20 that diverge and propagate towards the missile 10 as indicated by the arrows 22. The missile detector assembly 14 detects the pulses 20 along with the mid-infrared radiation detected from the engines 16. The pulses 20 cause the detector assembly 14 to develop erroneous directional control signals that direct the missile 10 away from the aircraft 12, resulting in a successful countermeasures operation by saving the aircraft from impact of the missile.

Presently available infrared emitters are unduly large and heavy, which results in an undesirable increase in the size and weight of the countermeasures system 18 containing the emitter. A larger and heavier countermeasures system 18 is undesirable because, for example, such a system may not fit into available space within an aircraft and may adversely affect the flight capabilities of the aircraft 12. Some older countermeasures systems 18 included cesium arc lamps or incandescent heat sources for generating the required mid-infrared radiation. Due to the relatively low intensity of the emitted radiation, the emitter in such countermeasures systems 18 has a large reflector to gather and to collimate the radiation to provide a beam of adequate intensity to jam the missile. Such a reflector may have to be mounted partially or completely on the outside of the aircraft 12, introducing excessive drag particularly at high aircraft speeds. To improve countermeasures systems 18, lasers have been utilized in place of cesium arc lamps or incandescent heat sources. Various types of lasers have been utilized in countermeasures systems 18, including semiconductor lasers to reduce the size and weight of and improve the overall performance of the system. Any of these conventional systems 18, particularly those utilizing semiconductor lasers, have difficulties generating mid-infrared radiation having sufficient power to jam the missile 10 at long ranges from the aircraft 12.

There is a need therefore for a mid-infared laser having a compact size that generates mid-infared radiation having high power sufficient to jam missiles at long ranges.

SUMMARY OF THE INVENTION

According to one aspect of the present invention, a mid-infrared emitter subsystem includes a heat sink and a diamond thermal diffusion layer connected to the heat sink through a first thermal bonding layer. The first thermal bonding layer has a first melting point. A semiconductor slab portion of a semiconductor laser is connected to the diamond thermal diffusion layer through a second thermal bonding layer. The second thermal bonding layer has a second melting point that is less than the first melting point.

BRIEF DESCRIPTION OF THE DRAWINGS

FIG. 1 illustrates a countermeasures situation in which a missile is attacking an aircraft containing an infrared countermeasures system.

DETAILED DESCRIPTION OF PREFERRED EMBODIMENTS

Figure 2:
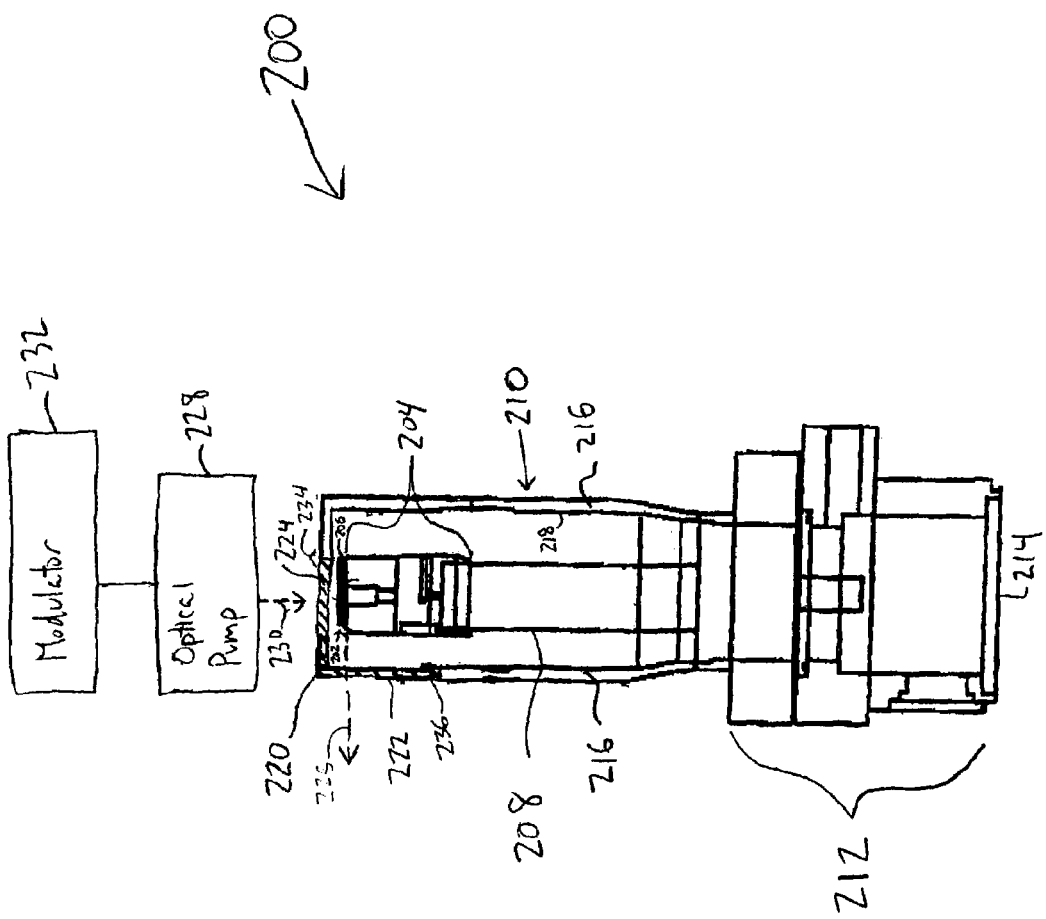
FIG. 2 a functional cross-sectional view of an infrared emitter including a semiconductor laser that may be utilized in the countermeasures system of FIG. 1 according to one embodiment of the present invention.

FIG. 2 is a functional and structural cross-sectional view of an infrared emitter 200 including a semiconductor laser 202 that may be utilized in the countermeasures system 18 of FIG. 1 according to one embodiment of the present invention. The infrared emitter 200 includes a heat sink module 204 coupled to the semiconductor laser 202 in such a way that the heat sink module very efficiently removes heat generated by the laser during operation. By very efficiently removing heat generated by the laser 202, the laser is kept cool during operation and this increases the efficiency of the laser. This increased efficiency of the laser 202 enables the laser to efficiently generate relatively high power mid-infrared radiation having a power of greater than one watt. The very efficient cooling of the laser 202 also reduces the overall size of the infrared emitter 200, making the emitter well suited for use in countermeasures systems in military aircraft.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

In the embodiment of FIG. 2, the laser 202 includes a semiconductor slab 206 mounted on top of the heat sink module 204. The slab 206 is mounted to the heat sink module 204 to very efficiently remove heat generated by the slab during operation of the laser 202, as will be discussed in more detail below with reference to FIG. 3. A cold finger 208 is connected to the heat sink module 204 to withdraw heat from the module. Heat generated by the semiconductor slab 206 is withdrawn through the heat sink module 204 and is thereafter withdrawn through the cold finger 208, which thermally contacts the heat sink module to a cryogenic cooler (not shown). In this way, the cryogenic cooler is thermally coupled to the heat sink module 204 through the cold finger 208. In operation, the cryogenic cooler withdraws heat from the heat sink module 204 through the cold finger 208 by cooling the heat sink module. The cryogenic cooler thus discharges the heat generated by the semiconductor slab 206 to the environment external to the infrared emitter 200.

The semiconductor slab 206, heat sink module 204 and cold finger 208 are contained in a housing 210 having flanges 212 attached at a bottom end. The flanges 212 are adapted to be connected at a bottom end to the cryogenic cooler to withdraw heat from the emitter 200. The housing 210 includes housing walls 216 that are polished on interior surfaces 218 to improve the thermal properties of these walls. In one embodiment, the interior surfaces 218 are coated with gold. A window 220 having an output portion 222 and a pump portion 224 is formed in the housing walls 216 adjacent the semiconductor slab 206. The window 220 is transparent to the mid-infrared frequency of radiation generated by the slab 206 to allow this radiation to propagate out of the housing 306 through the output portion 222, as illustrated by the dotted line 226. An optical pump 228 generates optical energy 230 that propagates through the pump portion 224 of the window 220 to "pump" or excite atoms in the slab 206, as will be described in more detail below. A modulator 232 controls the optical energy 230 generated by the optical pump 228.

In operation of the emitter 200, the modulator 232 modulates the intensity of the optical energy 230 generated by the optical pump. The optical energy 230 propagates through the pump portion 224 of the window 220 to optically pump the semiconductor slab 206. More specifically, in response to the optical energy 230 atoms in the semiconductor slab 206 are excited and, upon excitation, emit infrared radiation, as will be understood by those skilled in the art. The emitted infrared radiation is reflected back and forth between ends of the slab 206, which in this way function as mirrors. A portion of the infrared radiation incident on the end of slab 206 nearer the output portion 222 of the window 220 is allowed to pass through this end and then propagates through the output portion of the window as illustrated by the arrow 226. An optics assembly (not shown) collimates the infrared radiation propagating through the output portion 222 of the window 220 to form a relatively narrow beam of radiation propagating in a direction indicated by the arrow 226. This narrow beam of infrared radiation has sufficient power to jam the detector assembly 14 (FIG. 1) of the missile 10 (FIG. 1) at relatively great distances from the emitter 200. The optics assembly also typically includes a system of lenses along with components to direct the emitted narrow beam of radiation in a desired direction. The modulator 232 typically controls the optical pump 228, which would typically include a semiconductor laser, to supply pulses of optical energy 230 to the semiconductor slab 206. These pulses of optical energy 230 result in a pulsing of infrared radiation emitted by the semiconductor slab 206, with these radiation pulses passing through the output portion 222 of the window 220 and thereafter through the optics assembly (not shown) to form the series of infrared radiation pulses 20 of FIG. 1.

The infrared emitter 200 provides a better balance of the thermodynamic mechanisms relevant to such a cryogenic system, such as the hermetic seals 234 and 236 which allow for a small "cryogenic chamber" corresponding to the interior of the housing 210. The embodiment of FIG. 2 cools the heat sink module 204 to cryogenic temperatures of less than 77 degrees Kelvin. By calculating the heat transfer via residual gas conduction as well as radiative conduction, the housing 210 may be reduced to its minimum size without sacrificing cooling performance. In addition to correctly sizing the housing 210, the polishing and possibly gold coating of the interior walls 218 of the housing 210 as previously discussed further reduce heat transfer.

In one embodiment of the emitter 200, the window 220 is formed from sapphire having a specific crystal orientation that allows the window to be reliably mounted to the housing walls 216. More specifically, junctions 234 and 236 between the sapphire window 220 and the housing walls 216 must provide a hermetic seal to allow a good vacuum to be developed in the interior of the housing 210 containing the laser 202. This is true because the vacuum in the interior of the housing 210 thermally insulates the laser 202 from the outside environment for maintenance of a cryogenic temperature in the semiconductor slab 206, as previously described. This hermetic seal at the junctions 234 and 236 allows a very good vacuum to be developed in the interior of the housing 210, which reduces the required size of the housing. A good vacuum is a very good thermal insulator and thus the size of the housing 210 may be very small in the embodiment of FIG. 2. Conversely, where a poor vacuum is developed, as in conventional infrared emitters, the size of the housing must be much larger to provide sufficient thermal insulation between the laser in the interior of the housing and the outside environment in which the emitter is situated.

Figure 3:
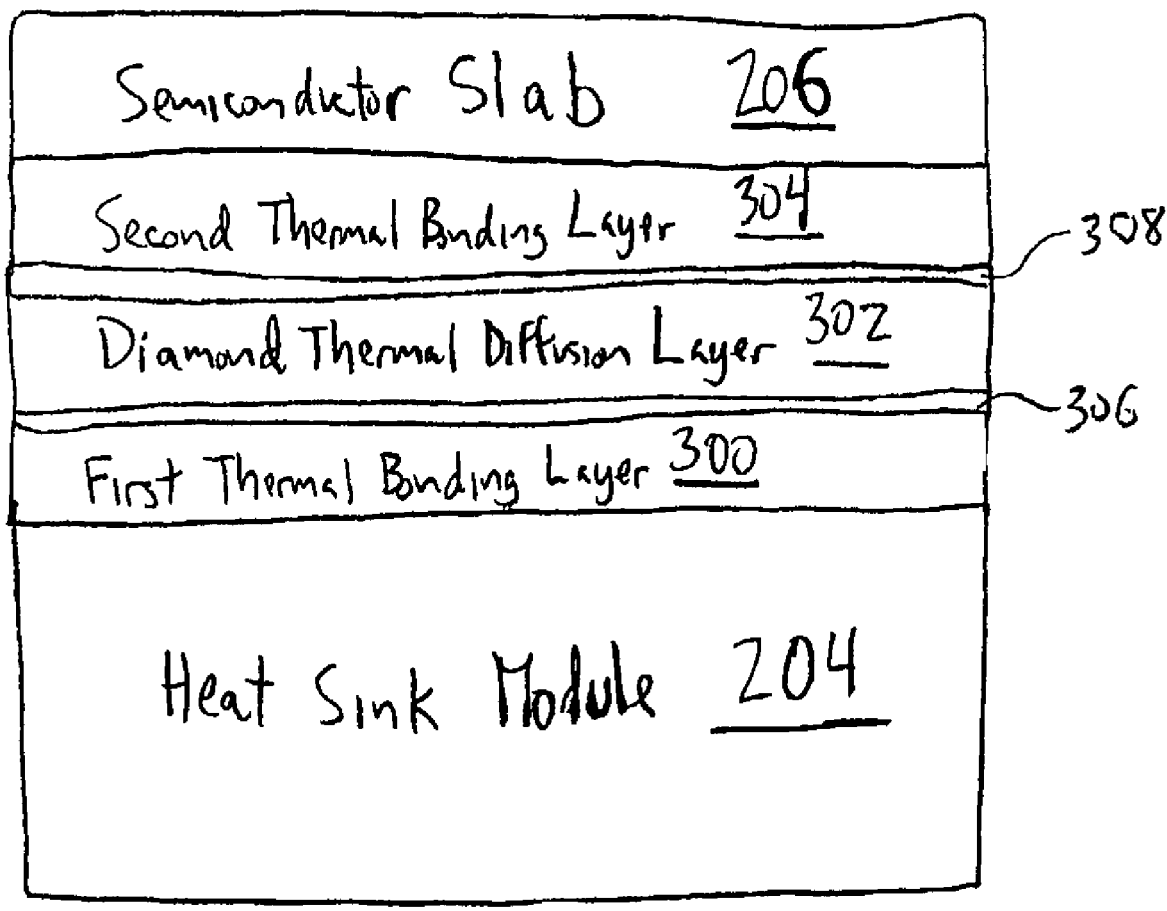
FIG. 3 is more detailed cross-sectional view showing the mounting of a semiconductor layer of the laser and heat sink module of FIG. 2 according to one embodiment of the present invention.

As previously mentioned, the specific way in which the heat sink module 204 thermally contacts the semiconductor slab 206 is an aspect of the present invention. FIG. 3 is a more detailed cross-sectional view showing the mounting of the semiconductor slab 206 of the laser 202 to the heat sink module 204 of FIG. 2 according to one embodiment of the present invention. The heat sink module 204 is attached by a first thermal bonding layer 300 to a diamond thermal diffusion layer 302 which, in turn, is attached by a second thermal bonding layer 304 to the semiconductor slab 206. In one embodiment, the semiconductor slab 206 is formed of gallium antimonide. The heat sink module 204 is gold-coated along a top side to which the diamond thermal diffusion layer 302 is attached via the first thermal bonding layer 300. The preferred material for the diamond thermal diffusion layer 302 is a CVD diamond and is coated along top and bottom surfaces with a tri-metal coating layers 306 and 308 having an exterior formed of titanium, platinum, and gold. This diamond has extremely high thermal diffusivity at cryogenic temperatures and thus operates to very efficiently remove heat from the semiconductor slab 206. The tri-metal coating layers 306 and 308 may be entirely formed of titanium, platinum, and gold or may include these materials only on the exterior surface of such layers which are attached to the bonding layers 300 and 304, respectively. These tri-metal coating layers 306 and 308 provide good adhesion of the diamond thermal diffusion layer 302 to the thermal bonding layers 300 and 304. In one embodiment, the diamond thermal diffusion layer 302 has a thickness of 400-800 microns to achieve optimal thermal conduction.

In forming the structure of FIG. 3, the diamond thermal diffusion layer 302 is first bonded to the heat sink module 204 via the first thermal bonding layer 300. To form this bond, the first thermal bonding layer 300 is positioned between the diamond thermal diffusion layer 302 and heat sink module 204. This structure is then heated, causing the first thermal bonding layer 300 to flow and thereby adhere to the tri-metal coating layer 306 of the diamond diffusion layer 302 and also to adhere to the heat sink module 204. After the tri-metal coating layer 306 of the diamond thermal diffusion layer 302 is bonded to the heat sink module 204, the second thermal bonding layer 304 is positioned between the tri-metal coating layer 308 of the diamond thermal diffusion layer 302 and semiconductor slab 206. This whole structure is then once again heated, causing the second thermal bonding layer 304 to flow and thereby adhere to the tri-metal coating layer 308 of the diamond diffusion layer 302 and to also adhere to the semiconductor slab 206.

During this process, note that the structure is heated to cause the second thermal bonding layer 304 to flow and form the corresponding bonds after the first thermal bonding layer 300 has been flowed to form the corresponding bonds. As a result, the melting points of the first and second thermal bonding layers 300 and 304 must be appropriately chosen so that during flowing of the second thermal bonding layer the first thermal bonding layer does not once again flow. More specifically, the melting point of the second thermal bonding layer 304 must be lower than the melting point of the first thermal bonding 300. This enables the second thermal bonding layer 304 to be flowed without once again melting the first thermal bonding layer 300.

In addition to forming a very efficient thermal conduit between the heat sink module 204 and the semiconductor slab 206 via the diamond thermal diffusion layer 302, the two thermal bonding layers 300 and 304 must be formed from materials that are ductile over the temperature range of interest and that are thus tolerant of repeated thermal cycling. Any cracking in the layers 300 and 304 or separation of these layers from the adjoining layers reduces the efficiency of the heat transfer provided by this structure. Such reduced heat transfer will increase the operating temperature of the semiconductor slab 206 which, in turn, reduces the efficiency of the laser 202 (FIG. 2) and thereby lowers the output power of the laser. Two possible combinations of materials for the first and second thermal bonding layers 300 and 304 have been found to provide the required physical bonding and thermal properties. These two combinations are shown in the Table 1 below:

TABLE 1

| Possible Combos | First Thermal Bonding Layer 300 | Second Thermal Bonding Layer 304 |
|---|---|---|
| Combination #1 | 100% Indium | 52% Indium/48% Tin |
| Combination #2 | 60% Indium/40% Lead | 97% Indium/3% Silver |

The bonding structure of FIG. 3 very efficiently removes heat from the semiconductor slab 206 and thereby maintains the slab at temperatures low enough to efficiently operate. In order to achieve high peak powers, it is necessary to exhaust heat away from the semiconductor slab 206 as efficiently as possible. The specific metallization of the diamond thermal diffusion layer 302 in conjunction with the described materials for the thermal bonding layers 300 and 304 creates a thermal conduit through which heat can flow from the semiconductor slab 206 to the heat sink module 204 very efficiently.

The bonding structure of FIG. 3 not only allows high peak output powers from the laser 202 due to the efficient cooling of semiconductor slab 206, but also allows duty cycles in excess of 25% to be used by the modulator 222 of FIG. 2. When operating at duty cycles of 25% or greater, the average energy incident upon the semiconductor slab 206 can be very high, exacerbating thermal loss mechanisms within the slab that reduce output power. High duty cycles capable with the structure of FIG. 3 are advantageous because such duty cycles are necessary for the infrared emitter 200 to be contained in the infrared countermeasures system 18 and be effective against real-world threats.

Even though various embodiments and advantages of the present invention have been set forth in the foregoing description, the above disclosure is illustrative only, and changes may be made in detail and yet remain within the broad principles of the present invention. Moreover, some of the functions performed by various elements may be combined to be performed by fewer elements, separated and performed by more elements, or combined into different functional blocks. The present invention is to be limited only by the appended claims.

What is claimed is:

1. A mid-infrared emitter subsystem, comprising:
a heat sink;
a diamond thermal diffusion layer connected to the heat sink through a first thermal bonding layer, the first thermal bonding layer having a first melting point;
a semiconductor slab portion of a semiconductor laser connected to the diamond thermal diffusion layer through a second thermal bonding layer, the second thermal bonding layer having a second melting point that is less than the first melting point; and
wherein, the first thermal bonding layer consists of approximately 100% Indium and the second thermal bonding layer consists of approximately 52% Indium and 48% Tin; or
wherein the first thermal bonding layer consists of approximately 60% Indium and 40% Lead and the second thermal bonding layer consists of approximately 97% Indium and 3% Silver.

2. The mid-infrared emitter subsystem of claim 1 wherein the diamond thermal diffusion layer comprises a CVD diamond.

3. The mid-infrared emitter subsystem of claim 2 wherein the diamond thermal diffusion layer has a thickness substantially in the range of 400-800 microns.

4. The mid-infrared emitter subsystem of claim 1 wherein the heat sink is gold-coated along at least a portion of a surface to which the diamond thermal diffusion layer is attached via the first thermal bonding layer.

5. The mid-infrared emitter subsystem of claim 1 wherein the semiconductor slab consists of gallium antimonide.

6. The mid-infrared emitter subsystem of claim 5 wherein the semiconductor slab functions to generate infrared radiation having a wavelength in the range of 2-5 microns.

7. A mid-infrared emitter, comprising:
a housing including housing walls having interior surfaces, the interior surfaces of the walls defining an interior of the housing and the interior containing, a heat sink;
   a diamond thermal diffusion layer connected to the heat sink through a first thermal bonding layer, the first thermal bonding layer having a first melting point;
   a semiconductor slab portion of a semiconductor laser connected to the diamond thermal diffusion layer through a second thermal bonding layer, the second thermal bonding layer having a second melting point that is less than the first melting point; and
a window contained in the at least one of the walls of the housing, the window being mounted to each of the walls to provide a hermetic seal; and
wherein, the first thermal bonding layer consists of approximately 100% Indium and the second thermal bonding layer consists of approximately 52% Indium and 48% Tin; or
wherein the first thermal bonding layer consists of approximately 60% Indium and 40% Lead and the second thermal bonding layer consists of approximately 97% Indium and 3% Silver.

8. The mid-infrared emitter of claim 7 wherein the interior surfaces of the housing are polished.

9. The mid-infrared emitter of claim 8 wherein the interior surfaces of the housing are gold-coated and polished.

10. The mid-infrared emitter of claim 7 wherein the heat sink is gold-coated along at least a portion of surface to which the diamond thermal diffusion layer is attached via the first thermal bonding layer.

11. The mid-infrared emitter of claim 7 wherein the semiconductor slab consists of gallium antimonide.

12. The mid-infrared emitter of claim 7 wherein the window comprises sapphire.

13. The mid-infrared emitter of claim 7 wherein a vacuum is developed in the interior of the housing to provide thermal insulation of components contained in the interior of the housing from an outside environment in which the housing is placed.

14. A method of attaching a heat sink to a semiconductor slab in an infrared emitter, the method comprising:
   placing a first thermal bonding layer on a first surface of the heat sink, the first thermal;
   placing a diamond thermal diffusion layer on the first thermal bonding layer;
   heating the heat sink, first thermal bonding layer, and diamond thermal diffusion layer to a temperature greater than or equal to the first melting point;
   placing a second thermal bonding layer on a second surface of the heat sink, the second thermal bonding layer having a second melting point that is less than the first melting point;
   placing the semiconductor slab on the second thermal bonding layer;
   heating the heat sink, first thermal bonding layer, diamond thermal diffusion layer, second thermal bonding layer, and semiconductor to a temperature greater than or equal to the second melting point; and
   wherein placing the first thermal bonding layer comprises forming the first thermal bonding layer consisting of approximately 100% Indium and placing the second thermal bonding layer comprises forming the second thermal bonding layer consisting of approximately 52% Indium and 48% Tin; or
   wherein placing the first thermal bonding layer comprises forming the first thermal bonding layer consisting of approximately 60% Indium and 40% Lead and placing the second thermal bonding layer comprises forming the second thermal bonding layer consisting of approximately 97% Indium and 3% Silver.

15. The method of claim 14 wherein the diamond thermal diffusion layer is formed through a chemical vapor deposition process.

16. The method of claim 14 further comprising cycling through cryogenic temperatures the structure formed through the prior operations.

* * * * *